United States Patent [19]

Shepard

[11] 4,417,352

[45] Nov. 22, 1983

[54] MICROPHASE STEPPER EMPLOYING IMPROVED DIGITAL TIMING INCREMENTER EMPLOYING A RATE MULTIPLIER

[75] Inventor: Leonard F. Shepard, Lake Grove, N.Y.

[73] Assignee: ILC Data Device Corporation, Bohemia, N.Y.

[21] Appl. No.: 146,512

[22] Filed: May 5, 1980

[51] Int. Cl.³ .................... H03K 5/15; H03K 3/86; H03K 17/28; H03H 7/18
[52] U.S. Cl. ......................... 377/43; 328/55; 328/154; 328/155; 377/47; 377/52
[58] Field of Search .................. 328/38, 55, 155, 154; 377/43, 44, 47, 48, 52

[56] References Cited

U.S. PATENT DOCUMENTS

| | | | |
|---|---|---|---|
| 3,586,985 | 6/1971 | Schoendorff | 328/154 X |
| 3,808,464 | 4/1974 | Fletcher et al. | 328/154 X |
| 3,838,296 | 9/1974 | McLeod | 328/154 X |
| 3,932,816 | 1/1976 | MacGregor | 328/154 X |
| 3,969,638 | 7/1976 | Marchetti et al. | 328/154 X |
| 4,095,186 | 6/1978 | Vesel | 328/55 X |
| 4,166,249 | 8/1979 | Lynch | 328/155 |
| 4,180,778 | 12/1979 | Worthington | 328/155 |
| 4,190,807 | 2/1980 | Weber | 328/155 X |
| 4,220,010 | 9/1980 | Meisner et al. | 328/154 X |
| 4,280,099 | 7/1981 | Rattlingourd | 328/155 X |
| 4,290,022 | 9/1981 | Puckette | 328/55 |
| 4,358,741 | 11/1982 | Nardin | 328/155 X |

FOREIGN PATENT DOCUMENTS 2755796  7/1978  Fed. Rep. of Germany ...... 328/155

OTHER PUBLICATIONS

Model 2055A Phase Micro Stepper Manual, Dated Oct. 1973 Published by Austron, Inc., 1915 Kramer La., Austin TX.

Primary Examiner—Felix D. Gruber
Attorney, Agent, or Firm—Weinstein & Sutton

[57] ABSTRACT

Apparatus for imparting a delay to an input signal utilizing counter means comprised of a plurality of binary coded decimal counter stages connected in cascade. The high frequency input signal applied to the counter undergoes a divide-by $10^N$ operation wherein N equals the number of binary coded decimal stages. Preferably, the least significant stage is adapted to be selectively and periodically preset to a binary coded decimal value different from its normal reset state to either increase or reduce the number of pulses required to cause the counter stage to read a terminal count to selectively either advance or retard the phase of the reduced frequency output signal developed at the output of the counter relative to the phase of the input signal applied to the counter in accordance with a preprogrammed value set into said counter stage. The number of advance or retard phase offsets may be adjusted over a wide range through the employment of a rate multiplier which sets the aforementioned presettable decade stage a predetermined number of times over a given time interval. The rate at which the said presettable decade stage is set is controlled by an adjustable rate generator which drives the rate multiplier. The number of times which the digital time incrementer is preset over the aforesaid interval is controlled by the setting of the adjustable rate multiplier.

Input means are provided for substituting one high frequency input source for another without imposing any additional delay in the signal undergoing a phase adjustment due to the substitution.

The digital time incrementer is advantageously incorporated into a microphase stepper capable of providing extremely small precision changes in phase as between an input and an output frequency wherein the output frequency is either equal to or a multiple or submultiple of the input frequency.

31 Claims, 4 Drawing Figures

MICROPHASE STEPPER EMPLOYING IMPROVED DIGITAL TIMING INCREMENTER EMPLOYING A RATE MULTIPLIER

BACKGROUND OF THE INVENTION

The present invention relates to frequency adjustment systems and more particularly to novel electronic solid state apparatus for imparting a phase or frequency delay to an input signal, phase correction being made without danger of introducing abrupt changes in the output frequency by introducing a precise number of very small phase advance or phase retard offsets at a high adjustable repetition rate.

In applications employing high frequency clocks of extremely high precision, such as cesium clocks, for example, it is well-known that the output frequency of such clocks experiences a drift in phase, and it is therefore necessary to periodically introduce a phase shift correction in order to be able to employ such clocks as reliable time standards. Systems presently available for imparting frequency and/or phase offsets of this nature require long warm-up times and are also known to impart spurious shifts in frequency resulting in the introduction of errors which are themselves more significant than the desired phase offset.

One technique for obtaining the desired result is to employ a digital time incrementer which is comprised of a plurality of counter stages, each being capable of counting in binary coded decimal (BCD) fashion, said BCD stages being connected in cascade. A signal applied to the input of the digital time incrementer thus undergoes a divide-by $10^N$ operation where N is equal to the number of counter stages employed in the digital time incrementer.

Each BCD counter stage is further designed to be forced to a particular BCD count which differs from the normal BCD count in order to obtain the desired phase advance or phase retard operation by altering the number of pulses applied to the BCD counter stage which is necessary to cause the stage to reach a terminal count. Switch means are settable to force the BCD counter stage to the desired phase retard or phase advance condition a predetermined number of times, the maximum number of repetitive operations typically being no greater than $10^6$. In the event that a large offset is required, the larger offset is accommodated by forcing the setting of a more significant BCD counter stage such as, for example, the divide-by 10; divide-by 100; divide-by 1,000 or divide-by 10,000 BCD counter stage of the counter, thereby significantly increasing the size of the delay imparted to the output signal, which also undergoes a reduction in frequency as a function of the number of BCD counter stages employed in the counter.

The above technique has been found to have a significant disadvantage in that a phase advance or phase retard step introduced into a more significant BCD counter stage has been found to introduce undesirable abrupt changes of significant magnitude into the output signal which prohibits the use of the digital time incrementer of the type described in high frequency applications requiring smooth transitions in the phase offset. Thus, high frequency generators requiring a large phase adjustment cannot be adjusted satisfactorily through the use of presently-available techniques.

BRIEF DESCRIPTION OF THE INVENTION

The present invention is characterized by comprising an all electronic solid state device for introducing a highly accurate phase adjustment into a high frequency signal typically in the megahertz range or greater, by imparting a plurality of extremely fine phase offsets at a high repetition rate, thereby avoiding all the aforementioned disadvantages of both conventional apparatus and the aforementioned state of the art apparatus.

The digital time incrementer of the present invention is an all solid state device comprising a counter having a plurality of counter stages, each stage being designed to count in a binary coded decimal (BCD) fashion. The least significant (i.e. divide-by units) counter stage incorporates a group of control inputs for receiving a binary coded decimal (BCD) input capable of forcing the count in the least significant BCD counter stage to a decimal value other than a normal starting value. Insertion of a first predetermined BCD value causes the said counter stage to be advanced by input pulses to its terminal count by an amount of input pulses less than the amount normally required while forcing a second predetermined BCD value into the least significant stage causes said counter stage to be advanced by input pulses to its terminal count by an amount of pulses greater than the amount normally required, the former technique serving to advance the phase of the output signal relative to the input while the latter technique serves to retard the phase of the output signal relative to the input signal.

One of the said BCD values which is loaded into the least significant counter stage is an otherwise "invalid" binary coded decimal code which value the BCD state does not assume during normal operation. Thus, the least significant BCD counter stage steps through eleven counts when it is desired to retard the phase of the output signal relative to the input signal. Alternatively, the least significant BCD stage is preset to a count of 9 before initiating counting in order to advance the phase of the output signal relative to the input signal. It is thus possible to introduce a frequency offset as small as 100 nanoseconds.

In applications where it is desired to introduce a significantly large phase offset while at the same time preventing the output signal from experiencing any abrupt changes in signal level due to the phase offsets introduced, the digital time incrementer employs an adjustable rate generator, the output of which is controlled by an adjustable rate multiplier in order to develop a predetermined number of load pulses which are generated at a predetermined average rate over a preselected interval of time. These load pulses are employed to load the offset values into the digital time incrementer. The rate generator is capable of providing an adjustable output frequency over a range from 100 Hertz to 100 kilohertz for driving the rate multiplier. The rate multiplier, which is comprised of a plurality of BCD type counter stages incorporates settable means for setting the number of load pulses that each BCD stage will pass to the control input of the least significant stage of the digital time incrementer. Based upon a rate generator with an operating frequency of 100 kilohertz, and assuming a rate multiplier comprised of six BCD stages, it is possible to activate the control input of the least significant stage of the digital time incrementer over a range of from 1 to 100,000 times during a ten second interval. The interval may be altered by altering the number of stages employed in the rate multiplier and/or adjusting the operating frequency of the rate generator.

The phase offsets may be initiated either manually or automatically depending upon the needs of the particular application.

A solid state switching circuit is provided for coupling a pair of high frequency sources to the digital time incrementer and incorporates switch means for selectively coupling either one of two independent, high frequency sources to the digital time incrementer, thereby providing a means for substituting one high frequency source for another without imposing any additional delays into the system as a result of the substitution.

The digital time incrementer may be used to great advantage in a microphase stepper system capable of generating precise phase offsets of very small magnitude by reducing the input frequency and inserting a phase offset into the reduced input frequency through the use of a digital time incrementer and thereafter increasing the reduced frequency intermediate output signal which has been offset in phase, by an amount equal to the frequency reduction originally imposed whereby the incremental phase offset is a function of the intermediate frequency divided by the input frequency.

OBJECTS OF THE INVENTION AND BRIEF DESCRIPTION OF THE FIGURES

It is therefore one object of the present invention to provide a novel solid state digital time incrementer for imparting fine phase offsets to respectively advance or retard the frequency of the developed output signal relative to the input signal and employing means for introducing a precise number of very fine offsets at a predetermined frequency rate to reach the desired offset in a smooth gradual fashion.

It is still another object of the present invention to provide means for imparting a phase offset to an input signal including adjustable rate generator means for driving adjustable rate multiplier means to adjustably select the rate of change of frequency offset over a wide range.

Still another object of the present invention is to provide apparatus for imparting a precise phase offset to a high frequency input signal and having means for selectively coupling one of a plurality of high frequency sources to the phase offsetting apparatus in a manner which avoids the introduction of any additional offset or delay due to substitution of one high frequency source for another.

The above as well as other objects of the invention will become apparent when reading the accompanying description and drawings in which.

DETAILED DESCRIPTION OF THE INVENTION

Figure 1:
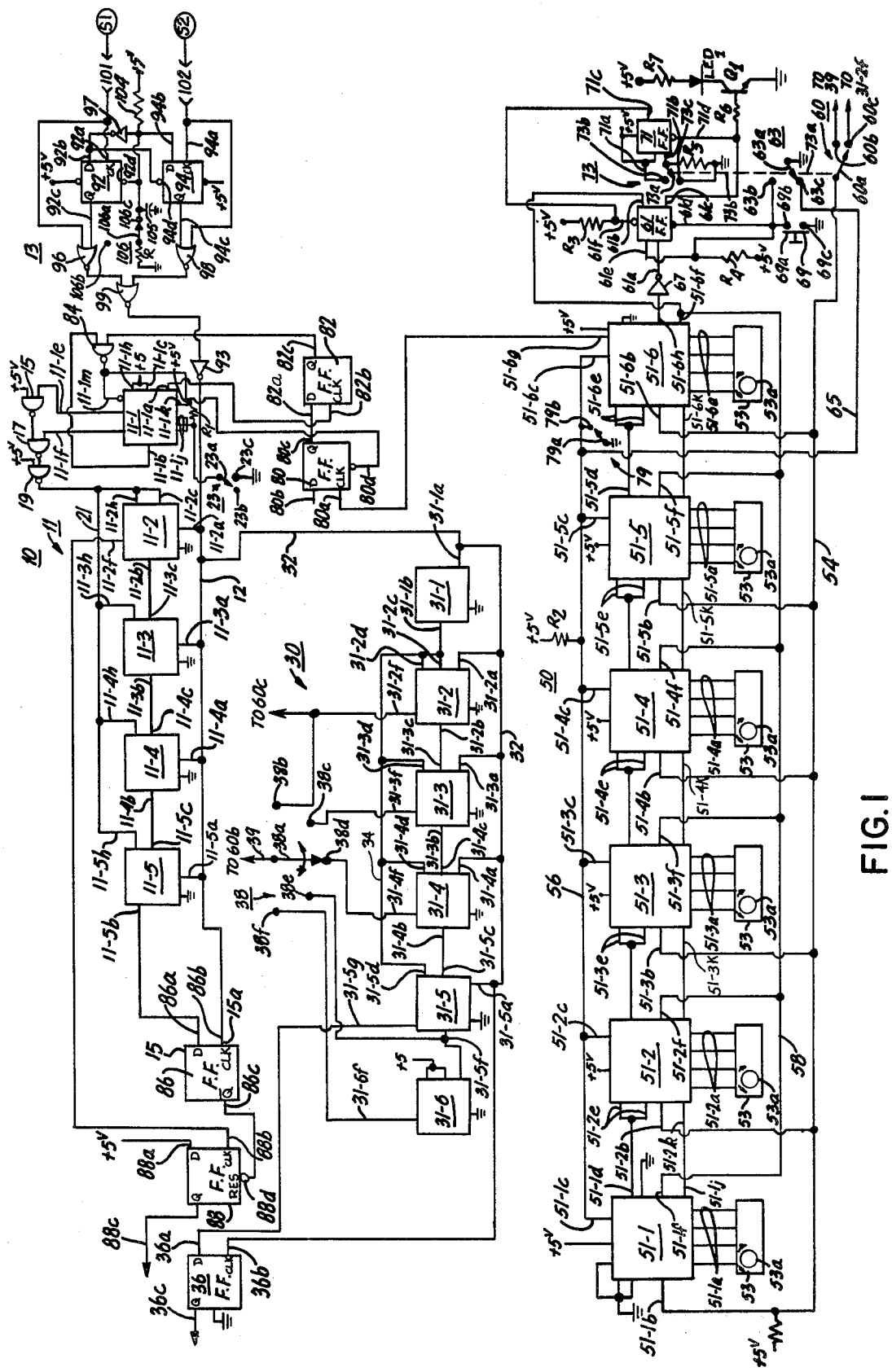
FIG. 1 shows a block diagram of a digital time incrementer designed in accordance with the principles of the present invention.

A digital time incrementer for selectively inserting a very fine delay increment into a signal having a predetermined frequency will now be described. In the preferred embodiment, individual delay increments of as small as 100 nanoseconds and having an upper limit which, if desired, can be in the range of the order of a second or more. As shown in FIG. 1, the digital time incrementer 10 comprises a divide-by $10^N$ counter 11 comprised of N stages. In the preferred embodiment shown in FIG. 1, N equals 5 yielding a five stage counter 11 comprised of stages 11-1 through 11-5. The stages 11-1 through 11-5 are each capable of normally counting pulses applied thereto in binary coded decimal (BCD)' fashion typically from decimal "0" and decimal "9", and then resetting to begin a new count when reaching the count of decimal "9".

Each BCD stage 11-1 through 11-5 requires four binary stages interconnected to step through a count of decimal "10" (i.e., from decimal "0" to decimal "9"). However, it is well-known that four binary stages are capable of counting from decimal "0" to decimal "15" (i.e. $000_2$ to $1111_2$). In order to count in BCD fashion, the four binary stages are appropriately wired to ignore the counts representing decimal "10" through decimal "15" which are considered to be "invalid" states during normal counting.

The present invention takes advantage of at least one of these otherwise invalid states to generate very fine offset increments, as will be described hereinbelow.

The clock input for counter 11 is comprised of a common bus 12 which is coupled to a high frequency input selection circuit 13 to be more fully described, which circuit functions to select between a pair of high frequency signal sources, allowing one high frequency signal source to be substituted for another in a way that avoids the introduction of an additional phase offset resulting from the substitution.

Common bus 12 is coupled to inputs 11-1a through 11-5a of the BCD stages 11-1 through 11-5, respectively. Bus 12 is further coupled to the clock input 15a of bistable flip-flop 15 and to bus 31 of the rate generator 30 to provide the high frequency signal which is divided down by rate generator 30 in a manner to be more fully described.

The clock pulses applied to bus 12 are simultaneously applied to each of the inputs 11-1a through 11-5a of stages 11-1 through 11-5.

Outputs 11-2b through 11-4b of stages 11-2 through 11-4 are respectively coupled to the inputs 11-3c through 11-5c of stages 11-3 through 11-5 in order to advance the count of the next most significant stage upon the occurrence of the next pulse on bus 12 when the next least significant stage coupled thereto reaches a capacity or terminal count.

The outputs 11-1e and 11-1f of stage 11-1f are coupled through gates 15, 17 and 19 to inputs 11-2h and 11-2c of stage 11-2 and to inputs 11-3h through 11-5h of stages 11-3 through 11-5, by way of common bus 21. As will be more fully described, stage 11-1 serves to enable stage 11-2 when it reaches a count representing decimal "8" instead of utilizing the conventional technique in which stage 11-2 is normally enabled when stage 11-1 reaches a count of decimal "9". Since the count between succeeding decimal "8" counts is identical to the count between succeeding decimal "9" counts, this technique does not introduce any undesirable offset into the system but is advantageously employed to prevent the occurrence of errors in switching. This technique is not be used between succeeding stages of counter 11 due to the fact that the rate at which output pulses are developed at succeeding output stages is reduced, i.e., is divided by successively increasing powers of ten.

Stage 11-1 normally counts a total of ten 100 nanosecond pulses before reaching a full count at which time stage 11-2 is incremented one count. Stage 11-2 counts ten 1 microsecond pulses before reaching a full count in order to advance stage 11-3 by one count, and so forth for the remaining stages, 11-3 through 11-5.

Decade stage 11-1 is provided with a group of three inputs 11-1j and an additional input 11-1k which collectively receive a group of four binary level input signals to be loaded into counter stage 11-1 when said stage receives a load offset signal at its input 11-1m.

Input 11-1k is directly coupled to a +5 volt DC source, which source is coupled in common to input group 11-1j through resistor R1. Switch 23 includes a switch arm 23a coupled in common to the group of inputs 11-1j and one terminal of resistor R1. Switch arm 23a is movable between a Retard offset switch position 23b and an Advance offset switch position 23c. In the Retard position, all four terminals 11-1j and 11-k are maintained at the binary "1" level. When the switch arm is moved to the advance offset position 23c, inputs 11-1j are all maintained at ground potential while input 11-1k is maintained at +5 volts DC. These values respectively represent binary inputs 1111 and 0001, respectively representing decimal "15" and decimal "1" in binary coded decimal format.

When it is desired to provide a delay (i.e. Retard offset) switch arm 23 is set to switch position 23b. When a signal is applied to load offset input 11-1m, the binary coded decimal counter stage 11-1 is forced into a count representing decimal "15" after reaching a count of decimal "9" and before reaching a count of decimal "0" causing stage 11-1 to step through eleven counts before reaching a final count of decimal "8". Thus, a delay of 100 nanoseconds is introduced into the output signal.

Conversely, when switch arm 23 is moved to the advance switch position 23c, a signal is applied to the load enable input 11-1m when stage 11-1 reaches a count of decimal "9" forcing stage 11-1 to a count of decimal "1" thus omitting the decimal "0" count whereby stage 11-1 counts through nine counts before reaching the output count of decimal "8", thus, advancing the offset of the output signal relative to the input signal by a time interval of 100 nanoseconds.

Briefly summarizing the operation, assuming that no offset is desired, 10 MHz pulses are applied to input 11-1a. Every ten (10) pulses accumulated cause counter stage 11-1 to develop an output pulse. This operation is repeated in a regular pattern. The input frequency is 10 MHz, and the output pulse rate is 1 MHz. However, each output pulse from counter stage 11-1 is in phase synchronism with every tenth (10th) input pulse.

By applying a decimal "15" state to inputs 11-1j and 11-1k of counter stage 11-1 when counter stage 11-1 reaches its terminal count (i.e., decimal "9"), the counter stage 11-1 advances to a decimal "15" count upon the occurrence of the next 10 MHz input pulse. Thereafter, counter stage 11-1 advances to a count of decimal "0", "1", "2", . . . , "9" accumulating eleven (11) input pulses before reaching a terminal count. The output pulse is now offset from the tenth (10th) input pulse by one pulse width of the input pulses. Assuming no further offset inputs are applied, the offset introduced will remain constant.

Applying a decimal "1" to inputs 11-1j and 11-1k of counter stage 11-1 causes the counter stage 11-1 to skip over the decimal "0" count and advance to the decimal "1" count, thus reaching terminal count after counting only nine (9) pulses, to develop output pulses offset by one pulse width of the input pulse relative to every tenth (10) input pulse.

Since the offset increment is quite small and since it is desirable to provide a digital time incrementer capable of imparting both large and small offsets to the output signal, the digital time incrementer 10 is coupled to an adjustable rate multiplier 50 operated under control of an adjustable rate generator 30 in order to apply a large number of offset request signals over a short interval of time in order to provide a large magnitude offset which is achieved in a smooth and gradual manner to avoid the introduction of abrupt changes in the output signal.

The above objective is accomplished by means of rate generator 30 comprised of a plurality of divide-by 10 divider stages 31-1 through 31-6 connected in cascade fashion.

Common bus 32 is coupled to common bus 12 of digital time incrementer 10 and in turn is coupled in common to inputs 31-1a through 31-5a of divider stages 31-1 through 31-5. Outputs 31-1b through 31-4b of stages 31-1 through 31-4 are respectively coupled to inputs 31-2c through 31-5c of divider stages 31-2 through 31-5.

Common bus 34 couples output 31-1b of divider stage 31-1 to inputs 31-2d through 31-5d of stages 31-2 through 31-5, respectively.

Output 31-5g of divider stage 31-5 is coupled to the D input 36a of a D type bistable flip-flop 36. Common bus 32 is coupled to the clock input 36b of D-type flip-flop 36 whose output 36c develops a reduced frequency signal for use in the microphase stepper system of FIG. 2 as will be more fully described. In the present embodiment, the signal frequency of pulses at output 36c is 100 Hz.

Outputs 31-2f through 31-6f of divider stages 31-2 through 31-6 are coupled to the stationary terminals 38b through 38f of switch means 38 having a switch arm 38a coupled to common terminal 39 and being switchable to engage any one of the stationary contacts 38b through 38f. Common terminal 39 is coupled to contact 60b of switch 60, forming part of the rate multiplier 50 to be more fully described, to apply operating pulses to rate multiplier 50 at a frequency rate from 100 kilohertz to 10 Hertz depending upon the adjustment of switch means 38.

Rate multiplier 50 is designed to adjustably control the number of pulses developed by rate generator 30 to be applied to the load input of counter stage 11-1, whereby an offset of the desired magnitude is obtained through a combination of the operating frequency rate of the offset request pulses developed by the rate generator 30 and the number of pulses selectively coupled to the digital time incrementer 10 through the rate multiplier 50.

Rate multiplier 50 is comprised of a plurality of individual rate multiplier stages 51-1 through 51-6, each of which may, for example, be a type CD 4527B rate multiplier digital integrated circuit manufactured by RCA and which is a binary coded decimal type rate multiplier capable of producing an output pulse train whose frequency is proportional to the clock frequency and to a preprogrammed multiplier binary coded decimal (BCD) number which is set into the inputs comprising input group 51-1a through 51-6a of the multiplier stages 51-1 through 51-6. The input groups 51-1a through 51-6a receive a predetermined combination of binary level signals for causing the associated multiplier stage 51 so programmed to develop output pulses whose average frequency rate ($F_o$) is equal to the input frequency ($F_i$) times a value K where K is greater than 0 and equal to or less than 1, i.e., $F_o = KF_i$, where $0 < K \leq 1$. Thus, the output frequency is always less than or equal to the input frequency and, in general, is composed of pulses which are unevenly spaced.

Considering multiplier stage 51-1, the number of pulses passed lies in the range from 0 pulses of the input frequency to 10 pulses of the input frequency for every binary coded decimal count.

Each group of input terminals, such as, for example, the group 51-2a, is coupled to a switch operated encoder 53 which is comprised of a manually operable switch arm 53a capable of being positioned in any one of ten discrete positions representing the decimal digits "0" through "9". Each of the settable positions sets the encoder 53 to generate a binary coded decimal signal pattern representing the selected decimal digit to which the manually operable switch arm 53a is set. It should be understood that a similar type of switch is provided for each of the other stages 51-1 and 51-3 through 51-6.

The operating frequency for rate multiplier 50 is derived either from output 31-2f or from lead 39 of rate generator 30 which is coupled to common bus 54 through switch 60 comprised of switch arm 60a and stationary contacts 60b and 60c, stationary contact 60b being connected to line 39 and stationary contact 60c being connected to output 31-2f. With switch arm 60a electrically connected to stationary terminal 60c, the input frequency for operating rate multiplier 50 is maintained constant at the output frequency of divider stage 31-2, which in the present embodiment is 100 kiloHertz. By moving switch arm 60a into engagement with stationary contact 60b, any of the rates from 100 kHz through 10 Hz may be coupled to common bus 54.

Bus 54 couples the signal from rate generator 30 to inputs 51-1b through 51-6b of multiplier stages 51-1 through 51-6.

Common bus 56 is coupled to the CLEAR inputs 51-1c through 51-6c of multiplier stages 51-1 through 51-6 to normally maintain the CLEAR inputs at +5 volts DC through resistor R2.

Outputs 51-1d through 51-5d of multiplier stages 51-1 through 51-5 are coupled to the inputs 51-2e through 51-6e of multiplier stages 51-2 through 51-6. Common bus 58 couples a control signal from the output 61b of bistable flip-flop 61 to the Set To "9" inputs of the multiplier stages 51-1f through 51-6f to prevent output 51-6g of multiplier stage 51-6 from passing to the load input 11-1m of digital time incrementer 10.

Switch 63 having switch arm 63a and stationary contacts 63b and 63c, is provided to select either Automatic or Manual operation of rate multiplier 50. Stationary contact 63c is coupled through conductor 65 to common bus 56 to selectively couple common bus 56 to ground for a purpose to be more fully described.

Stationary contact 63b is coupled to Reset input 61d and D input 61c of D-type bistable flip-flop 61 to operate digital time incrementer 10 in the Automatic mode, as will be more fully described.

Output 51-6h of multiplier stage 51-6 is coupled to clock input 61e of D-type flip-flop 61 through inverter 67.

Inputs 61c and 61d of flip-flop 61 are maintained at +5 volts DC through resistor R4. These input terminals may be grounded either through coupling switch 63a to stationary contact 63b or through the momentary closure of pushbutton switch 69 comprised of bridging member 69a normally biased to an open position and adapted to bridge stationary contacts 69b and 69c to couple input terminals 61c and 61d to ground when pushbutton 69a is operated.

Set input 61f of bistable flip-flop 61 is normally maintained at +5 volts DC through resistor R3, which is also connected to the output 71c of bistable D-type flip-flop 71. Switch 73 comprises switch arm 73a and stationary contacts 73b and 73c which selectively couple the clock input 71b either to +5 volts DC or to ground. Output 61c of flip-flop 61 is coupled to reset input 71d of flip-flop 71 and is also coupled to the base electrode of transistor Q1 through resistor R6. The collector of Q1 is coupled to +5 volts DC through the series path comprised of resistor R7 and a light emitting diode LED 1, the emitter electrode of Q1 being connected to ground.

Switches 60, 63 and 73 are mechanically ganged together, said mechanical interconnection being represented by dotted lines 73a and 73b.

The multiplier stages 51-1 through 51-6 are electrically coupled in the "add" mode so that the clock pulses of each multiplier stage are summed with the clock pulses of every other stage in accordance with the following equation:

$$R_O = R_C[0.1X + 0.01X + 0.001X + 0.0001X + 0.00001X + 0.000001X];$$

where
$R_O$ = the output frequency rate
$R_C$ = the input clock rate
and X = the setting at each of the six rate multiplier stages, said setting being any value from decimal "0" to decimal "9".

As was mentioned hereinabove, output 51-6h of multiplier stage 51-6 is coupled through inverter 67 to the clock input of bistable flip-flop 61.

Assuming that it is desired to operate rate multiplier 50 in the manual mode, switch arm 63a is moved into engagement with stationary contact 63c. Switch arms 60a and 73a are moved in unison. By depressing pushbutton 69a, a negative level is applied to Reset input 61d of bistable flip-flop 61 causing output 61b to go high thereby removing the Set To "9" state from all of the stages 51-1 through 51-6. At this time, assuming that rate generator 30 applies pulses at the 100 kHz frequency to bus 54, a predetermined number of pulses of the 100 HKz pulse frequency will be passed by each of the multiplier stages through the outputs 51-1j through 51-5j of each multiplier stage 51-1 through 51-5 to the cascade inputs 51-2k through 51-6k of multiplier stages 51-2 through 51-6. Outputs 51-1d through 51-5d prevent stages 51-2 through 51-6 from passing the 100 KHz pulses.

Assuming that it is desired to pass only a single rate pulse, inputs 51-1a through 51-5a of stages 51-1 through 51-5 are set to the binary equivalent of decimal "0" while input 51-6a of stage 51-6 is set to the equivalent of decimal "1". After 100,000 pulses have been applied to input bus 54, only one pulse will appear at output 51-6g of multiplier stage 51-6 for application to the digital time incrementer 10 in a manner to be more fully described. Output 51-6h of multiplier stage 51-6 goes low at this time, which condition is inverted by inverter 67 to apply a positive going edge to clock input 61e of bistable flip-flop 61 to reset the bistable flip-flop and drive output 61b low, which causes the Set To "9" inputs 51-1f through 51-6f to inhibit their stages from any further counting. Thus, the input frequency signal undergoes a divide-by $10^6$ operation requiring a period of ten seconds between the first closure of pushbutton switch 69 to set bistable flip-flop 61 until it is reset by the first output pulse developed at output 51-6h of multiplier stage 51-6.

As another example, assuming that it is desired to generate 50,000 pulses per ten second interval, stages 51-2 through 51-6 have their encoders set to the equivalent of decimal "0" while stage 51-1 has its encoder set to the equivalent of decimal "5". It is possible to pass any number of pulses from rate generator 30 to digital time incrementer 10 from 0 to 999,999 over a ten (10) second interval, the desired number being determined by the six settable switches coupled to the input groups 51-1a through 51-6a of multiplier stages 51-1 through 51-6.

The inhibit outputs 51-1d through 51-5d of each multiplier stage is coupled to the inhibit input 51-2e through 51-6e of each succeeding multiplier stage to prevent each succeeding multiplier stage from transferring its pulses to output 51-6g until the previous multiplier stage has transferred its pulses, in order to prevent the passage of an erroneous number of pulses to counter 11.

As was mentioned hereinabove, when pushbutton 69 is initially depressed, output 61b of flip-flop 61 goes low. At the same time output 61c goes high to turn transistor Q1 on and thereby cause LED 1 to be turned on. The illumination of LED 1 provides an indication that the rate multiplier 50 is slewing. When the pulse developed at output 51-6h is aplied to clock input 61a of flip-flop 61, output 61c goes low, turning LED 1 off.

In order to obtain a full count of 1,000,000 pulses, the switch arm 79a of switch 79 is coupled to stationary contact 79b to ground common bus 56, preventing the rate multiplier from being cleared until a count of 100,000 is obtained.

When in the automatic mode, switch 63 couples common bus 56 to ground and switch 73 couples the clock input 71b of flip-flop 71 to ground. With switch contact 63b being connected to ground, bistable flip-flop 61 is reset in the same manner as was previously described when switch arm 69 is depressed causing a slewing period to begin. As soon as each period terminates, it is automatically repeated due to the fact that reset input 61d is connected to ground potential so that each 10 second interval is continuously repeated.

Bistable flip-flop 71 serves to automatically disable rate multiplier 50 when it is switched from Automatic mode to Manual mode to prevent the erroneous initiation of any subsequent offset operations. During Automatic mode, clock input 71b of flip-flop 71 is maintained at ground potential. Switching to Manual mode couples clock input 71b to +5 volts DC, causing Q output 71c to go low, applying a low level to SET input terminal 61f of bistable flip-flop 61 causing output 61c to go high and thereby maintaining each multiplier stage 51-1 through 51-6 in the Set To "9" state thereby preventing the passage of any pulses from rate multiplier 50 to counter 11.

The pulses passed by rate multiplier 50 are coupled to digital time incrementer 10 through bistable flip-flop 80. Output 51-6g of the rate multiplier stage 51-6 is coupled to the clock input 80a of bistable D-type flip-flop 80, whose D input 80b is maintained at +5 volts DC. The Q output 80c of bistable flip-flop 80 is coupled to D input 82a bistable D-type flip-flop 82. The clock input 82b of bistable flip-flop 82 is coupled to common bus 12. The Q output 82c of bistable flip-flop 82 is coupled to one input of NAND gate 84. The remaining input of gate 84 is coupled to output 11-1b of counter stage 11-1 of the digital time incrementer 10. The output of gate 84 is coupled in common to input 11-1m of stage 11-1 and to reset input 80d of bistable flip-flop 80.

A pulse appearing at output 51-6g of rate multiplier 50 commands bistable flip-flop 80 to toggle causing its output 80c to follow the level of input 80b. A high level is applied to D input 82a of bistable flip-flop 82 causing its output 82c to go high when the next 10 MHz pulse is applied to common bus 12 from the 10 MHz source (not shown) coupled thereto.

The high level output at terminal 82c is applied to one input of gate 84. As soon as stage 11-1 reaches a terminal count, its output 11-1b goes high which places a high at the remaining input of gate 84 causing the output of gate 84 to go low, removing the high level from input 11-1m and thereby allowing either a decimal "15" or a decimal "1" to be set into inputs 11-1j and 11-1k of stage 11-1, dependent upon the setting of switch 23.

The low level output of gate 84 functions as a reset pulse applied to reset input 80d of flip-flop 80 causing its output 80c to go low. The next 10 MHz pulse applied to clock input 82b of bistable flip-flop 82 causes output 82c to follow the level at input 82b which is now low. This low level is applied to the input of gate 84 coupled to terminal 82c causing the output of gate 84 to go high to inhibit loading of stage 11-1.

At the decimal "8" count, stage 11-1 develops an enabling signal which is applied to all of the remaining stages 11-2 through 11-5 through gates 15, 17 and 19 and common bus 21, in order to allow these stages to be incremented by the 10 MHz pulses applied thereto by bus 12 as will be more fully described, and also providing a carry signal to input 11-2c of stage 11-2 thereby enabling stage 11-2 to be incremented and further enabling stages 11-3 through 11-5 to be incremented only during the occurrence of a 10 MHz pulse and when they receive a carry signal from the previous counter stage 11-2 through 11-4, respectively, which greatly simplifies the decoding. Summarizing the operation of counter 11, stage 11-1 is incremented by 10 MHz pulses; stage 11-2 is incremented when the count of "8" output pulse of stage 11-1 coincides with a 10 MHz pulse; stage 11-3 is incremented when the count of "8" output pulse of stage 11-1 and the carry pulse of stage 11-2 coincide with a 10 MHz pulse. The operation of stages 11-4 and 11-5 is the same as stage 11-3.

Thus, it can be seen that flip-flops 80 and 82 together with gate 84 and the output 11-1b of stage 11-1, serve to limit the application of either a decimal "15" or a decimal "1" to be loaded into stage 11-1 only once per output pulse generated by rate multiplier 50.

When output 11-5b of counter stage 11-5 goes high, this high condition is applied to the D input 86a of bistable flip-flop 86. The next 10 MHz pulse applied to bus 12 is coupled to the clock input 86b of flip-flop 86 causing output 86c to go low and then to go high at the next succeeding 10 MHz pulse, to develop a very narrow pulse of $10^{-7}$ seconds pulse width. In order to widen these narrow pulses, output 86c of flip-flop 86 is coupled to the reset input 88d of D-type bistable flip-flop 88 whose D input 88a is maintained at +5 volts DC and whose clock input 88b is coupled to output terminal 11-2f of counter stage 11-2. When the level at reset input 88d goes low, output terminal 88c goes low. When stage 11-2 reaches a decimal "8" count, its output 11-2f applies a pulse to clock input 88b of flip-flop 88 causing output 88c to follow the level at input 88a and thereby go high to provide a negative pulse having a negative going leading edge, a positive going trailing edge and a pulse width of $10^{-6}$ seconds, thereby widening the pulses developed at output 88c at the 100 Hz rate to provide a more manageable pulse which simplifies system decoding and timing.

The rate generator 30 provides a 100 Hz undelayed signal at output 31-5g of stage 31-5. This pulse, which remains high for approximately 0.5 microseconds, is applied to the D input 36a of bistable flip-flop 36 to provide at output 36c an undelayed 100 Hz signal whose leading edge is synchronized by the 100 MHz clock which is coupled to clock input 36b of D-type bistable flip-flop 36. The delayed 100 Hz output at 88c and the undelayed 100 Hz output at 36c are utilized in the microphase stepper system to be more fully described in connection with FIG. 2.

Bistable flip-flop 86 serves to prevent the introduction of any unwanted delays propagating through the chain of stages of counter 11 from being introduced into the output 88c. Bistable flip-flop 86 is a precision flip-flop which locks the delayed and divided pulses developed by the digital time incrementer 10 to the 10 MHz clock, enabling the use of low power counter stages which need not exhibit the tight tolerances of flip-flop 86.

A selectable input circuit 13 for enabling the substitution of one high frequency clock source for another is comprised of a pair of bistable flip-flops 92 and 94 and gates 96-99. Inputs 101 and 102 are each designed for connection with a high frequency clock source, such as 10 MHz sources S1 and S2. Input 101 is coupled in common to one input of NOR gate 96 and to the clock input 92a of D-type bistable flip-flop 92. Input 102 is coupled in common to clock input 94a of D-type bistable flip-flop 94 and to one input of NOR gate 98. The remaining inputs of gates 96 and 98 are respectively coupled to the Q outputs 92c and 94c of D-type flip-flops 92 and 94. A +5 volt DC level is coupled to inverter 97 through resistor 104 and to the D input 94b of flip-flop 94. The output of inverter 97 is coupled to the D input 92b of bistable flip-flop 92 and to the set input 94d of flip-flop 94.

Resistor 104 also couples the +5 volt DC level to reset input 29d of bistable flip-flop 92. A capacitor 105 is coupled between ground reference and reset input 92d flip-flop 92. A manually operable switch 106 has its switch arm 106a adapted for selective connection to one of the stationary contacts 106b and 106c. Contact 106b is electrically isolated from the input circuit. Stationary contact 106c is connected to the common terminal between reset input 92d, capacitor 105, resistor 104, the input of inverter 97 and the D input 94b of bistable flip-flop 94.

The outputs of NOR gates 96 and 98 are coupled to respective inputs of NOR gate 99. The output of NOR gate 99 is coupled to inverter 93.

When switch 106 is open, i.e. when its switch arm 106a is connected to electrically isolated stationary contact 106b, +5 volts DC is simultaneously applied to: inverter 97, the reset input 92d of bistable flip-flop 92 and the D input 94b of bistable flip-flop 94. When the next 10 MHz clock pulse appearing at input terminal 102 is applied to clock input 94a, output 94c follows the level at input 94b, developing a high level signal which is applied to NOR gate 98. Output 94c remains high even during the occurrence of subsequent 10 MHz pulses. The high level applied to NOR gate 98 by flip-flop 94 prevents pulses from the 10 MHz source applied to input 102 from being passed by gate 98.

Inverter 97 inverts the high level applied to D input 94b to apply a low level to D input 92b of bistable flip-flop 92. Upon the occurrence of the next 10 MHz pulse applied to input 101 by a 10 MHz clock source, output 92c follows the level at D input 92b to apply a low level to one input of gate 96, which low level allows pulses applied to input 101 to be passed by gate 96 and gate 99. This condition persists so long as switch arm 106a engages contact 106b.

When NOR gate 98 has a constant high level applied to one of its inputs, its output is at a constant low which does not prevent gate 99 from passing clock pulses passed by gate 96.

When switch arm 106a engages contact 106c, a low level is applied to input 94b and a high level is applied to D input 92b by inverter 97, reversing the output levels at 94c and 92c to low and high levels respectively whereby gate 96 prevents pulses appearing at input 101 from being passed to gate 99 while gate 98 passes pulses appearing at input 102 to the input of gate 99.

The levels of outputs 92c and 94c are switched by the leading edge of each 10 MHz pulse. These pulses are applied to the digital timing incrementer 10 and to the rate generator 30 through inverter 93 which inverts the output pulses passed by gate 99 whereby the trailing edges of the pulses applied to the digital time incrementer 10 and rate generator 30 control the timing of the digital time incrementer 10 and rate generator 30. Thus, any switchover from one 10 MHz source to the other occurs during the "dead" time interval of the 10 MHz pulse train to avoid the introduction of any additional errors or delays into the operation of the digital time incrementer 10.

Summarizing, the operation of the digital time incrementer 10 is as follows:

The desired phase offset is obtained by imparting a predetermined number of fine incremental offsets to the input signal. The total number of incremental phase offsets imparted to the input signal may be imparted at any one of a plurality of selectable rates. The number of incremental phase offsets applied at the selected rate is also adjustable.

In order to impart a phase offset to the 10 MHz source, the rate selection switch arm 38a of rate selection switch 38 is positioned to engage one of the stationary contacts 38b through 38f to select the desired pulse rate at which phase offsets are imparted to the input signal. The number of load pulses at the selected pulse rate to be applied to the load control input 11-1m of 11-1 of the counter 11 is selected by setting the appropriate binary coded decimal numbers at the inputs 51-1a through 51-6a of rate multiplier 50. Presuming operation in the automatic mode, switch 63 is placed in the automatic position by moving switch arm 63a into engagement with stationary contact 63b, which simultaneously causes switch arm 73a to engage stationary contact 73c and switch arm 60a to engage stationary contact 60b, due to the mechanical interconnections between switches 60, 63 and 73, which are ganged together as was previously described.

Of course, only one 10 MHz source need be connected to either of the inputs 101 or 102 of switchable input circuit 13. However, assuming that it is desired to substitute one 10 MHz source for another, this is accomplished by coupling a substitute 10 MHz source to the remaining one of inputs 101 and 102, operating switch arm 106a to the appropriate switch position, thereby removing the previously selected 10 MHz source from actively driving digital time incrementer 10 and allowing the last mentioned 10 MHz source to be removed from the incrementer circuit 10, if desired, for maintenance and/or repair.

Each pulse applied to the load input 11-1m of stage 11-1 in the counter 11 transfers a binary coded decimal code of either "15" or "1" into stage 11-1, depending upon the particular type of offset selected, i.e. either a retard or an advance offset.

Stage 11-1 thus has its contents forced to the decimal "15" stage, for example, to obtain a retarded offset, once during the occurrence of each pulse applied to its load input 11-1m from the output 51-6g of rate multiplier 50. The pulses from rate multiplier 50 are applied to counter stage 11-1 over a ten second interval. At the end of this interval, flip-flop circuits 61 and 71 serve to automatically terminate subsequent operation, when operating in the automatic mode. The binary coded decimal inputs of rate multiplier 50 may be set to represent any decimal value from 000000 through 999999 to control the total number of load pulses applied during the aforementioned ten (10) second interval. Closing switch arm 79a to its stationary contact 79b allows a decimal count of 1,000,000 to be obtained. The application of small offset increments assures that the offsets are introduced into the output in a smooth fashion, eliminating the introduction of any abrupt changes or glitches in the output signal of digital time incrementer 10, while introducing the fine offset increments at a high repetition rate permits the introduction of a total offset of a large magnitude.

The manual mode is substantially identical to the automatic mode. The automatic mode allows the ten second intervals to be continuously repeated whereas the manual mode requires operation of pushbutton switch 69 in order to initiate the introduction of a new offset.

It should be understood that whereas the preferred embodiment describes the time interval during which advance or retard offset values are introduced into stage 11-1 of counter 11, other time intervals may be selected. For example, the output of stage 31-1 of rate generator 30 may be wired to be connected to rate selection switch 38. Alternatively, one of the stages 51-1 through 51-6 of rate multiplier 50 may be omitted to reduce the time interval to one second.

As was mentioned hereinabove, LED 1 remains illuminated during the time that the rate generator 30 is slewing.

Figure 2:
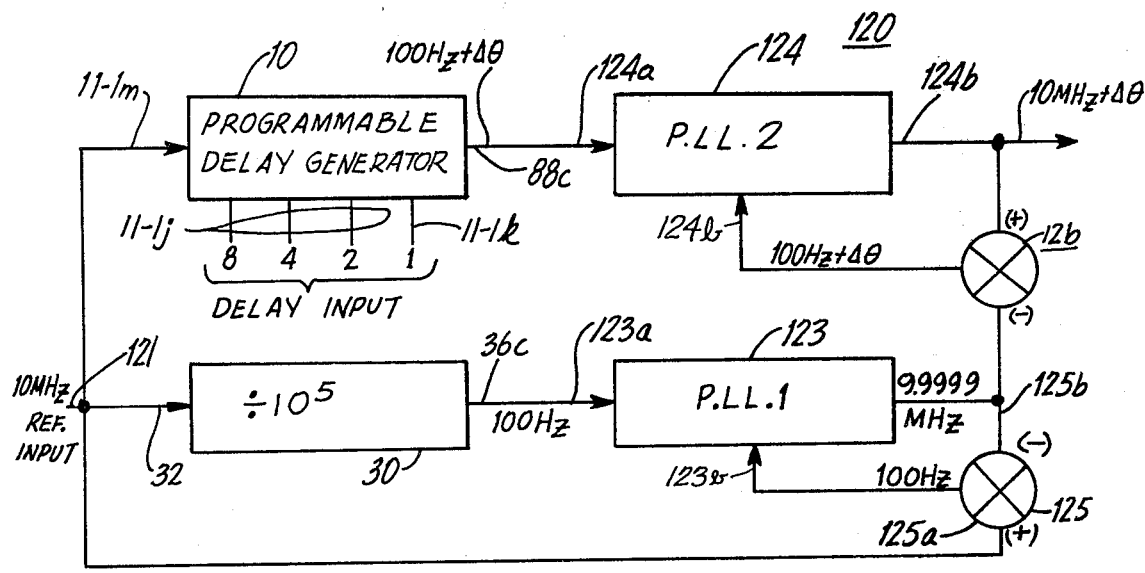
FIG. 2 shows a block diagram of a microphase stepper system employing the digital time incrementer of FIG. 1.

The digital time incrementer 10 may be employed to great advantage in the microphase stepper circuit shown in FIG. 2.

As shown in FIG. 2, the microphase stepper 120 comprises a 10 MHz reference input signal from a suitable source (not shown) such as a cesium clock, for example, which is applied to input terminal 121 for coupling to input 102 (see FIG. 1) which is coupled to input 32 of rate generator 30 which functions as a divide-by $10^5$ divider circuit to the input 12 of digital time incrementer 10 (see also FIG. 1) and to (+) input 125a of mixer 125. Rate generator (divider) circuit 30 divides the 10 MHz reference input signal down to a 100 Hz signal which signal is employed as a reference for the phase-locked loop 123 employed to develop the 9.9999 MHz phase-locked loop which represents the phase-locked offset frequency, said 100 Hz signal being applied at input 123a of phase-locked loop 123.

Figure 3:
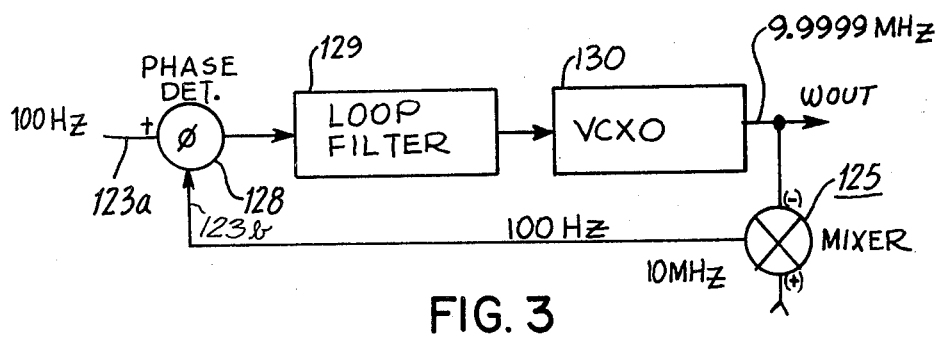
FIG. 3 is a block diagram showing one of the phase-locked loops of FIG. 2 in greater detail.

FIG. 3 details the implementation of the phase-locked loop wherein input 123a is coupled to one input of phase detector 128 whose other input 123b is coupled to the output of mixer 125. the output of phase detector 128 is coupled to the input of loop filter 129. Filter 129 is a low pass filter which serves to pass only the DC component of the phase detector output which level is coupled to the input of voltage controlled crystal oscillator 130. The voltage controlled crystal oscillator 130 generates a signal which is regulated by a DC signal representing the relative phase of the 100 Hz signal developed by mixer 125 and that developed by divider circuit 30 in order to generate a highly accurate reference or offset signal having a frequency of 9.9999 MHz.

Figure 3A:
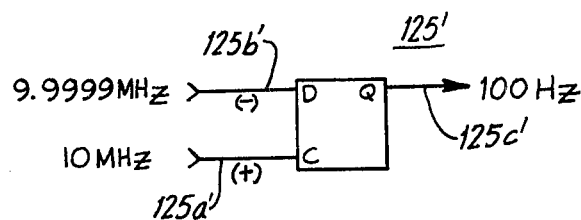
FIG. 3a is a block diagram showing one of the preferred embodiments of the mixers of FIG. 2 in greater detail.

The phase-locked loop 123 thus develops a stable coherent offset frequency. The mixer 125 is preferably a type "D" flip-flop, connected as shown in FIG. 3A in which the bistable flop-flop 125' receives the offset frequency (9.9999 HMz) at its "D" input 125b' and receives the reference input (10 MHz) at its C(clock) input 125a' and develops an output square wave at its Q output 125c' which signal has a frequency equal to the difference between the frequencies respectively applied to the "D" and clock (C) input. The nature of the type "D" flip-flop 125' is such that the Q output 125c' follows the level at the D input 125b' upon the occurrence of a clock pulse at 125a'. The use of the type "D" flip-flop 125' as a mixer is highly advantageous since no additional filtering of the Q output 125c' is required.

The 100 Hz signal developed at the output 36c of divider 30 (see also FIG. 1) is applied to the input 11-1m of digital time incrementer 10 (see also FIG. 1) which offsets the 100 Hz intermediate signal as a function of the number of offset values which are applied to the programmable inputs 11-1j and 11-1k (see also FIG. 1). Digital time incrementer 10 receives each 100 Hz pulse appearing at the output of divide-by $10^5$ divider (i.e. rate generator) circuit 30, which pulses are applied to the load input 11-1m of counter stage 11-1 provided in digital time incrementer 10 for loading the BCD values appearing at inputs 11-1j and 11-1k.

Digital time incrementer 10 imposes the prescribed number of delay increments so that output 88c (see also FIG. 1) generates a 100 Hz output signal which is displaced (i.e. offset) in time from the 100 Hz pulse developed by rate generator 30 by an amount equal to the basic offset increment of digital time incrementer 10 multiplied by the desired total number of delay increments in accordance with the preprogammed setting of switch 38 and settable switch encoders 53 (see FIG. 1). Thus, for each 100 Hz pulse appearing at output 36c, there is a corresponding 100 Hz pulse appearing at output 88c (see FIG. 1), which is delayed from each 100

Hz pulse appearing at output 36c by an amount equal to the number of offset values applied to stage 11-1. In the example given, the delayed 100 Hz output pulses have a minimum delay increment of 100 nanoseconds and a maximum delay of 999.9999 microseconds. The time delay between two successive 100 Hz pulses can be converted to a phase, for example, as is described in detail in copending application Ser. No. 075,971, filed Sept. 17, 1979 now U.S. Pat. No. 4,358,741, issued Nov. 9, 1982.

The delayed 100 Hz output pulses are applied to the input 124a of phase-locked 124 which cooperates with mixer 126 to develop an output signal whose frequency is the same as the reference input (or a multiple or submultiple of the reference input) applied at reference input terminal 121 and having a predetermined delay.

The transfer function of phase-locked loop 124 given by equation (1), as follows:

$$\Delta\theta_{OUT} = [\Delta\theta_{IN}/(1+F(s)K/S)] + [\theta_1/(1+F(s)K/S)] \quad (1)$$

Where:
$\theta_{IN}$ = Change in phase of the input signal
$\theta_1$ = the phase of $\omega_1$
$F(s)$ = Transfer function of the loop filter
$K/S$ = Loop gain In equation (1) it is clear that as the phase of the input signal changes, the output phase varies by the same amount. This being the case, equation (1) can be utilized to determine the time displacement of the output MHz signal, wherein:

$$\Delta'_{10\ MHz} = \Delta'_{100\ Hz}(1 \times 10^2)/(1 \times 10^7) = \Delta'_{100\ Hz}(1 \times 10^{-5}) \quad (2)$$

The phase-locked loop 124 is substantially the same as that shown in FIG. 3 wherein a phase detector (128 in FIG. 3) compares the delayed output signal of digital time incrementer 10 against the output signal appearing at the output of a mixer (mixer 126 in FIG. 2). The voltage controlled oscillator 130 which in the case of phase-locked loop 124 is designated to generate a 10 MHz signal, is coupled to the phase detector 128 through a loop filter 129 and has its output fed back to phase detector 128 through the mixer (mixer 126 shown in FIG. 2).

The preceding description details the operation of the micro time and phase stepper 120 of FIG. 2 to demonstrate the manner in which the system 20 may be utilized to digitally time shift or phase shift a frequency in very fine increments. It should be understood that the principles described herein are not limited to the frequencies given and at that any frequency may be delayed and further that the system may be designed for any desired time or phase increment based upon the analysis presented. The phase or time delay can be incremented statically by inserting a fixed input into counter 21 or dynamically by continuously incrementing or decrementing the delay unit at a predetermined rate.

Although the above example is directed toward imposing delay (i.e. retard) increments upon the signal applied to input 121, it should be understood that the offset increments may be applied to advance the output signal relative to the input signal with the total advance in phase being a function of the basic delay increment times the total number of delay increments applied to stage 11-1. A latitude of modification, change and substitution is intended in the foregoing disclosure and, in some instances, some features of the invention will be employed without a corresponding use of other features. Accordingly, it is appropriate that the appended claims be construed broadly in a manner consistent with the spirit and scope of the invention herein.

What is claimed is:

1. A digital time incrementer for offsetting the phase of an input signal comprising a counter having a plurality of counter stages, each designed to count in binary coded decimal fashion for dividing said input signal by $10^N$ where N = number of said stages;

at least one of said counter stages having loading means for inserting any desired binary coded decimal value into said one counter stage;

the final stage of said counter producing an output signal;

a high frequency pulse source;

an input for coupling to said source of high frequency pulses;

adjustable digital multiplier means coupled between said input and said counter;

means for loading the predetermined binary coded decimal value applied to said loading means into said one counter stage in response to each output pulse passed by said digital multiplier means when said counter stage reaches a predetermined count;

said digital multiplier means comprising settable means enabling said digital multiplier means to pass an output signal comprising a predetermined number of pulses generated by said high frequency pulse source as a function of the setting of said settable means whereby the total phase offset of the output signal of said counter relative to the input signal received by said counter is equal to the sum of the pulses applied to said pre-loading means.

2. The digitial time incrementer of claim 1 further comprising means for disabling said digital multiplier means after said high frequency pulse source has generated a predetermined number of pulses.

3. The digital time incrementer of claim 1 further comprising means for adjustably altering the operating frequency of said high frequency pulse source.

4. The digital time incrementer of claim 1 wherein said means for loading further comprises settable switch means for applying a first binary coded decimal input to said loading means when set in a retard offset switch position to provide a retarded offset and for applying a second binary coded decimal input to said loading means when set in an advance offset switch position to provide an advance offset.

5. The digital time incrementer of claim 4 wherein the binary coded decimal value loaded into said one counter stage and associated with said advance switch position includes means for forcing the said one counter stage to a binary state which causes the said one counter stage to reach a full count at least one input pulse time sooner than normal.

6. The digital time incrementer of claim 5 wherein said one counter stage includes means to begin a count at decimal "0" and to count to decimal "9" and means responsive to a predetermined count in said one counter stage and the next pulse from said multiplier means for loading a binary count representing decimal "1" into said one counter stage.

7. The digital time incrementer of claim 5 wherein said one counter stage includes means for counting from a binary count (0000) representing decimal "0" to a binary count (1111) representing decimal "15" means for resetting said one stage to the count representing decimal "0" when said one counter stage is at a count representing decimal "9" and the next pulse from said input source is coupled to said one counter stage;

said second binary coded signal forcing said one counter stage to a count representing decimal "15";

said one counter stage thereafter being advanced to the count representing decimal "0" upon receipt of the next pulse of said input signal passed to said one counter stage.

8. The digital time incrementer of claim 7 wherein said one stage comprises the least significant stage of said counter.

9. The apparatus of claim 8 further comprising advance/retard switch means and means for applying a first predetermined binary code to said presettable input means when said switch means is set to a first position and for applying a second predetermined binary code to said presettable input means when said switch means is set to a second position.

10. The digitial time incrementer of claim 4 wherein the binary coded decimal value loaded into said one counter stage and associated with said retard switch position includes means for forcing the said one stage to a binary state which causes the said one stage to reach a full count at least one input pulse time later than normal.

11. The digitial time incrementer of claim 1 further comprising selector circuit means having first and second inputs each capable of receiving either said input signal or an auxiliary input signal equivalent to said input signal and an outlet coupled to the input of said counter;

switch means for coupling one of said first and second inputs to said output; said switch means causing the switching between said first and second inputs during the dead time between pulses generated by said input means and said auxiliary input means.

12. The digital time incrementer of claim 1 further comprising apparatus for selectively coupling one of a pair of high frequency signal sources to said digital time incrementer without introducing any additional delay in the output, due to the switchover operation comprising:

first and second input terminals and an output terminal;

first and second logical gating means respectively coupled to said first and second input terminals for selectively passing signals applied to their associated inputs to their outputs;

third logical gating means coupled to the outputs of said first and second logical gating means for coupling signals applied to said third logical gating means to said output terminal;

switch means having a first and a second switch position for selectively coupling one of said high frequency sources to said digital time incrementer; and selection means coupled to said first and second input terminals and said switch means and responsive to said switch means being in said first switch position and the next pulse received from the associated high frequency source for disabling said first logical gating means and responsive to said switch means being in said second switch position and the next pulse received from the associated high frequency pulse source for disabling said second logical gating means.

13. The apparatus of claim 12 wherein said selection means comprises first and second bistable circuits each having a control input, a clock input and an output;

said clock inputs being coupled to an associated one of said input terminals;

said switch means including means for establishing different binary levels at said control inputs; and said outputs being coupled to an associated one of said first and second logical gating means.

14. Apparatus for introducing a delay into an input signal having a predetermined frequency comprising;

a digital counter having an input for receiving said input signal and having an output for generating an output signal, said counter having a plurality of stages, each stage including means for counting pulses in a binary coded decimal fashion; and presettable binary coded decimal input means for presetting one of said stages to a predetermined binary coded decimal value;

means connecting said stages to cause said counter to generate an output signal of reduced frequency;

means for generating offset request pulses responsive to said input signal;

loading means associated with said one stage and responsive to each offset request pulse for applying a binary coded decimal value to the associated presettable input to alter the count developed by said stage; and settable multiplier means for setting the number of offset request pulses coupled to said loading means; whereby said counter develops an output signal whose frequency ($F_{OUT}$) is reduced from the frequency ($F_{IN}$) of said input signal by an amount $F_{OUT}=F_{IN}/10^M$, where M=the number of stages of said counter and whose output signal $F_{OUT}$ is offset in phase relative to the phase of the input signal as a function of the number of incremental binary coded decimal values introduced into said counter stage, and the location of the said counter stage receiving said binary coded decimal values.

15. The apparatus of claim 14 wherein the binary coded signal generated by said loading means for loading a predetermined binary coded decimal value into a counter stage operative to alter the delay of the output signal comprises a binary code which represents a decimal count different from the maximum decimal count normally developed by each counter stage to cause said counter stage to count at least one additional pulse of said input signal before it reaches the starting decimal count normally developed by each counter stage.

16. The apparatus of claim 15 wherein said stages include counting means to normally count in binary coded decimal form from decimal "0" to decimal "9" and upon receipt of the next input signal pulse, to automatically be reset to decimal "0" from decimal "9", the counting means of said stages being responsive to count from a value different from decimal "9" and towards decimal "0" only when preset to said different value by said loading means.

17. The apparatus of claim 16 wherein said presettable value lies between decimal "10" and decimal "15".

18. The apparatus of claim 16 wherein said presettable value is decimal "15".

19. The apparatus of claim 14 wherein said means for generating offset request pulses comprises adjustable rate pulse generator means for periodically enabling said loading means once per offset request pulse wherein said pulses are generated N times per second at said rate which is adjustable over a range from $0 \leq N \leq F_{IN}$, where $F_{IN}$ is = to the frequency of said input signal.

20. The apparatus of claim 19 wherein said adjustable rate pulse generator means is comprised of a plurality of divider stages connected in cascade fashion;
means for coupling said input signal to the input of the first divider stage;
an output; and
switch means for selectively coupling the output of one of said divider stages to said settable multiplier means.

21. The apparatus of claim 20, wherein said input signal is derived from a high frequency source.

22. The apparatus of claim 20 further comprising means for initialing an offset operation; means responsive to said initialing means for generating an alarm to apprise an operator of the generation of rate pulses.

23. The apparatus of claim 19 further comprising means for initialing an offset operation; means coupled to said multiplier means for disabling said multiplier means responsive to a predetermined number of pulses passed by said coupling means.

24. The apparatus of claim 14 further comprising means responsive to an intermediate one of said counter stages and the last one of said stages in said counter for lengthening the pulse width of the output pulses generated by said counter.

25. Means for imparting a controlled phase shift to an input signal having a predetermined frequency $F_{IN}$ comprising:
first means for receiving said input signal;
means for generating a reference signal having a predetermined frequency;
first mixer means for mixing said input signal received by said first means with said reference signal to generate an intermediate signal having a frequency less than said input signal;
means for generating offset request signals;
second means responsive to said offset request signals for imparting a predetermined phase offset to said input signal in accordance with the desired phase shift determined by the total number of offset request pulses, including means for reducing said input signal to the frequency of said intermediate signal; digital multiplier means for selectively controlling the number of offset request pulses coupled to said second means; and
second mixer means for mixing the output of said second means with said references signal for generating an output signal having a frequency $F_O$, where $F_O = m/n\, F_{IN}$, where m and n are real integers, said output signal being delayed by an amount controlled by said second means; wherein said second means comprising:
a digital counter for receiving said input signal and having an output for generating an output signal, said counter having a plurality of stages, each stage including means for counting pulses in a binary coded decimal fashion;
presettable binary coded decimal input means for presetting one of said stages to a predetermined binary coded decimal value;
means for connecting said counter stages to enable the counter to generate an output signal whose frequency is reduced relative to said input frequency;
settable means for generating a predetermined number of advance offset request signals;
loading means associated with said one counter stage and responsive to each of said advance offset request signals for applying a binary coded decimal value to the associated presettable input to reduce the total number of input signals accepted by said counter stage before said stage develops an output signal; and
whereby said counter develops an output signal whose frequency ($F_{OUT}$) is reduced from the frequency ($F_{IN}$) of said input signal by an amount $F_{OUT} = F_{IN}/10^M$, where M = the number of stages of said counter and whose pulses are offset from the pulses of the signal $F_{IN}$ as a function of the number of binary coded decimal values introduced into said one stage and the location of said stage receiving said binary coded decimal values.

26. Apparatus for imparting a delay to an input signal having a predetermined frequency $F_{IN}$ comprising:
first means for deriving an intermediate signal from said input signal, said intermediate signal having a frequency less than said input signal;
frequency generator means for generating offset request pulses;
digital time incrementer means having an input for receiving said input signal, said digital time incrementer means including programmable offset input divider means for generating an output signal, which is delayed relative to said input signal, said offset being a function of the setting of said programmable delay input means and the number of offset request pulses applied to said programmable offset input means and wherein the frequency of said output signal is equal to the frequency of said intermediate signal;
multiplier means being settable for controlling the number of offset request pulses coupled to said offset input means;
a first phase-locked loop responsive to said intermediate signal and said input signal for generating a reference signal having a frequency equal to the difference of the frequencies of said input signal and said intermediate signal; and
a second phase-locked loop responsive to said reference signal and the output of said time incrementer means for generating an output signal having a frequency $F_O$, where $F_O = m/n\, F_{IN}$, where m and n are real integers, and having a delay which is a function of the delay imparted by said programmable offset input means and the ratio of the frequencies of said intermediate signal and said input signal.

27. The apparatus of claim 26 wherein each of said phase-locked loops is comprised of a phase detector; a voltage controlled oscillator controlled by said phase detector; and a mixer having one input coupled to the output of said voltage controlled oscillator a second input coupled to and an output coupled to said phase detector.

28. The apparatus of claim 27 wherein said frequency generating means comprises adjustable rate generator means coupled to said digital time incrementer means for repetitively delaying the input signal.

29. The apparatus of claim 28 wherein said rate generator means comprises adjustable means for adjusting the output of said oscillator means to a preselected rate.

30. Means for delaying an input signal having a first predetermined frequency comprising:

first means for reducing the frequency of said input signal by a predetermined amount to provide a second signal having a second frequency;

said first means including second means for delaying the second signal developed by said first means;

third means for increasing the frequency of the delayed second signal produced by said second means to produce an output signal having a third frequency $F_I$, where $F_I = m/n \, F_{IN}$, where m and n are real integers, whereby the total delay is composed of a plurality of delay increments which are a function of the ratio of said second and first frequencies;

means for generating offset request signals; and said second means being comprised of a chain of a plurality of binary coded decimal counter stages connected in cascade fashion, one of said stages being adapted to advance or retard the output signal by a delay increment having a delay interval which is a function of the position of said one divider stage in said chain responsive to said offset request signals; and adjustable means for controlling the number of offset request signals coupled to said one stage.

31. A digital time incrementer for offsetting the phase of an input signal comprising a counter having a plurality of counter stages, each designed to count in binary coded decimal fashion for dividing said input signal by $10^N$ where N = the number of said stages;

at least one of said counter stages having loading means for inserting any desired binary coded decimal value into said one counter stage;

the final stage of said counter producing an output signal;

an input for coupling to a source of high frequency pulses;

an adjustable digital multiplier means coupled between said input and said counter;

means for loading the predetermined binary coded decimal value to said loading means into said one counter stage in response to each output pulse passed by said digital multiplier means when said counter stage reaches a predetermined count;

said digital multiplier means comprising settable means enabling said digital multiplier means to pass an output signal comprising a predetermined number of pulses generated by said high frequency pulse source as a function of the setting of said settable means whereby the total phase offset of the output signal of said counter relative to the input signal received by said counter is equal to the sum of the pulses applied to said pre-loading means;

means for selectively coupling an input signal, which may be derived from either of two sources, to said counter without introducing any additional delay in the output due to the switchover operation comprising:

first and second input terminals and an output terminal;

first and second logical gating means respectively coupled with said first and second input terminals for selectively passing signals applied to their associated inputs to their outputs;

third logical gating means coupled to the outputs of said first and second logical gating means for coupling signals applied to said third logical gating means to said output terminals;

switch means having a first and a second switch position; and selection means coupled to said first and second input terminals and said means in response to said switch means being in said first switch position for disabling said first logical gating means, and responsive to said switch means being in said second switch position for disabling said second logical gating means.

* * * * *

UNITED STATES PATENT AND TRADEMARK OFFICE
CERTIFICATE OF CORRECTION

PATENT NO. : 4,417,352

DATED : November 22, 1983

INVENTOR(S) : Shepard

It is certified that error appears in the above—identified patent and that said Letters Patent is hereby corrected as shown below:

Column 2:

Line 34, change "state" to --stage--

Column 9:

Line 64, change "Q̄" to --Q--

Signed and Sealed this

Twenty-eighth Day of August 1984

[SEAL]

Attest:

GERALD J. MOSSINGHOFF

Attesting Officer

Commissioner of Patents and Trademarks